US012127486B2

(12) United States Patent
Yoon et al.

(10) Patent No.: US 12,127,486 B2
(45) Date of Patent: Oct. 22, 2024

(54) RESISTIVE RANDOM ACCESS MEMORY WITH PREFORMED FILAMENTS

(71) Applicant: LAM RESEARCH CORPORATION, Fremont, CA (US)

(72) Inventors: Hyungsuk Yoon, San Jose, CA (US); Thorsten Lill, Santa Clara, CA (US); Yang Pan, Los Altos, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 192 days.

(21) Appl. No.: 17/424,792

(22) PCT Filed: Jan. 13, 2020

(86) PCT No.: PCT/US2020/013304
§ 371 (c)(1),
(2) Date: Jul. 21, 2021

(87) PCT Pub. No.: WO2020/154123
PCT Pub. Date: Jul. 30, 2020

(65) Prior Publication Data
US 2022/0069218 A1    Mar. 3, 2022

Related U.S. Application Data

(60) Provisional application No. 62/796,818, filed on Jan. 25, 2019.

(51) Int. Cl.
*H10N 79/00*    (2023.01)
*H10B 63/00*    (2023.01)
*H10N 70/00*    (2023.01)

(52) U.S. Cl.
CPC ........... *H10N 70/066* (2023.02); *H10B 63/80* (2023.02); *H10N 70/023* (2023.02);
(Continued)

(58) Field of Classification Search
CPC ........ H10B 63/80; H10B 63/00; H10B 63/20; H10B 63/30; H10N 70/063; H10N 70/826;
(Continued)

(56) References Cited

U.S. PATENT DOCUMENTS 9,871,077 B2 *  1/2018  Xia ..................... H10B 63/80
2007/0267667 A1  11/2007  Ufert
(Continued)

FOREIGN PATENT DOCUMENTS

TW    I434408 B    4/2014
TW    I441367 B    6/2014

OTHER PUBLICATIONS

International Search Report and Written Opinion of the ISA issued in PCT/US2020/013304, mailed May 27, 2020; ISA/KR.
(Continued)

*Primary Examiner* — Thong Q Le

(57) ABSTRACT

A method for fabricating a plurality of resistive random access memory (RRAM) cells includes providing a substrate including a memory medium arranged on an underlying layer; creating channel holes in the memory medium having a first critical dimension in a range from 1 nm to 20 nm; depositing switching material defining a filament of the RRAM cells in the channel holes; depositing a top electrode of the RRAM cells on the memory medium and the switching material; and separating adjacent ones of the RRAM cells by etching the top electrode and the memory medium between adjacent ones of the channel holes.

16 Claims, 5 Drawing Sheets

(52) U.S. Cl.
CPC ......... *H10N 70/063* (2023.02); *H10N 70/068* (2023.02); *H10N 70/8833* (2023.02)

(58) Field of Classification Search
CPC .... H10N 70/883; H10N 70/00; H10N 70/023; H10N 70/066; H10N 70/068; H10N 70/20; H10N 70/8833; H10N 70/884; H10N 70/011; H10N 70/801; H10N 70/8418; G11C 13/0002; G11C 13/0069; G11C 11/1659; G11C 11/1673; G11C 11/1675; G11C 11/1693; G11C 13/0007; G11C 13/0014; G11C 13/0023; G11C 13/0026; G11C 13/0028; G11C 13/003; G11C 13/004; G11C 13/025; G11C 2213/33; G11C 2213/52; G11C 2213/74; G11C 2213/77; G11C 2213/79; G11C 2213/82

See application file for complete search history.

(56) References Cited

U.S. PATENT DOCUMENTS

| | | |
|---|---|---|
| 2010/0102306 A1 | 4/2010 | Hsu et al. |
| 2011/0193044 A1 | 8/2011 | Sandhu et al. |
| 2012/0238055 A1 | 9/2012 | Mikawa et al. |
| 2013/0099189 A1 | 4/2013 | Sandhu et al. |
| 2014/0252301 A1 | 9/2014 | Sandhu |
| 2015/0380643 A1 | 12/2015 | Miao et al. |
| 2016/0351256 A1* | 12/2016 | Xia ..................... H10N 70/826 |
| 2017/0365778 A1 | 12/2017 | Kim et al. |
| 2018/0205013 A1 | 7/2018 | Yi et al. |

OTHER PUBLICATIONS

Taiwanese Office Action and Search Report for Application No. TW109101922 issued Apr. 13, 2023.

\* cited by examiner

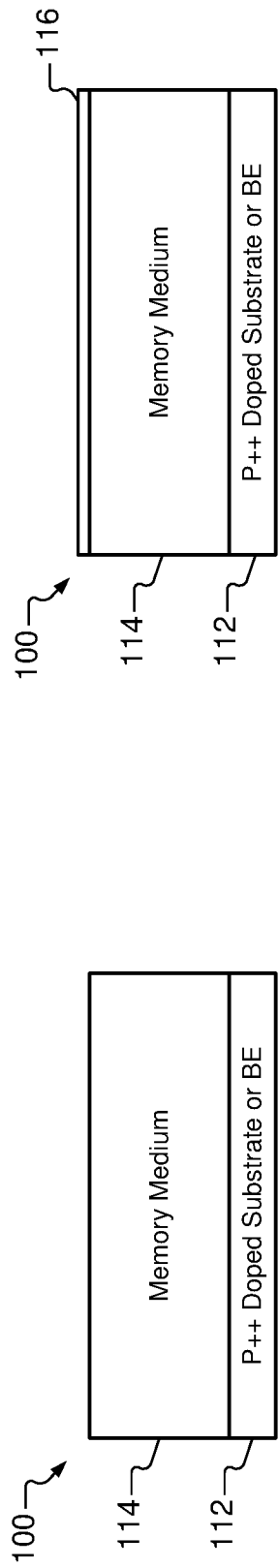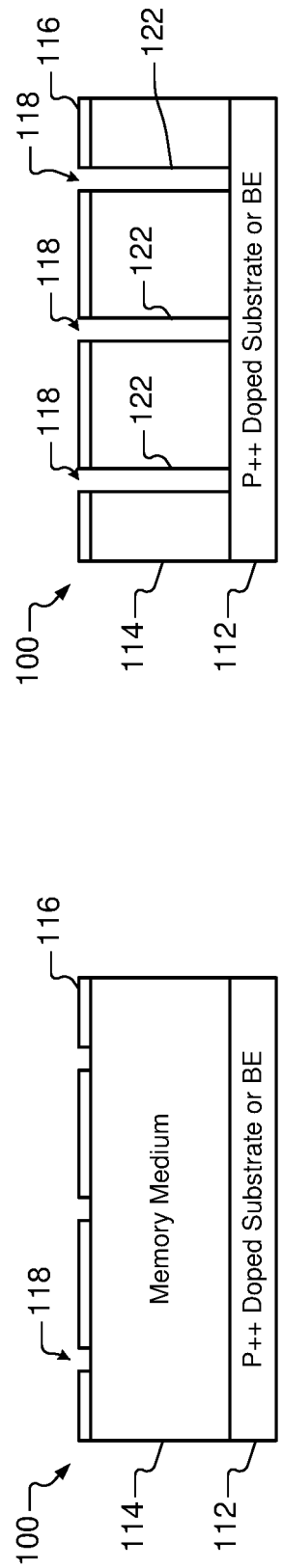

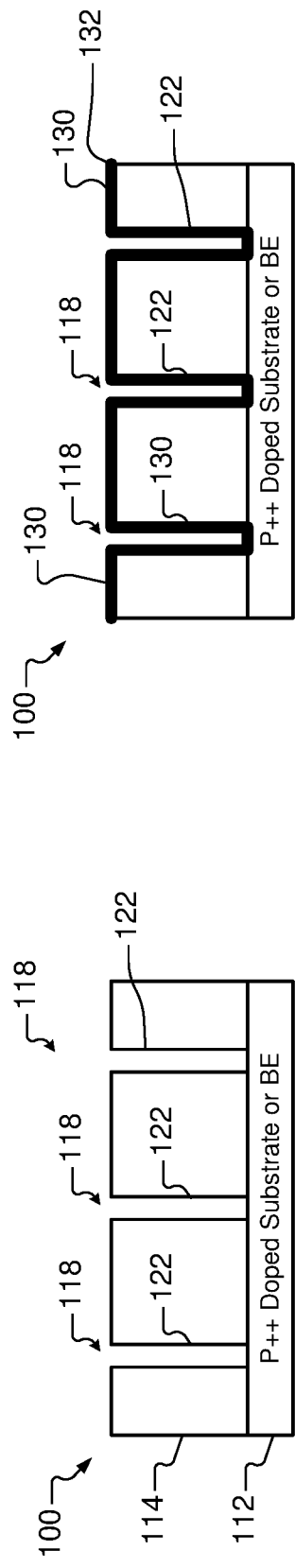
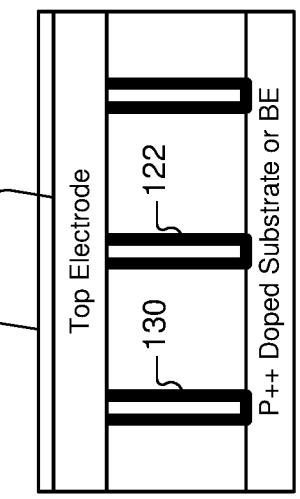
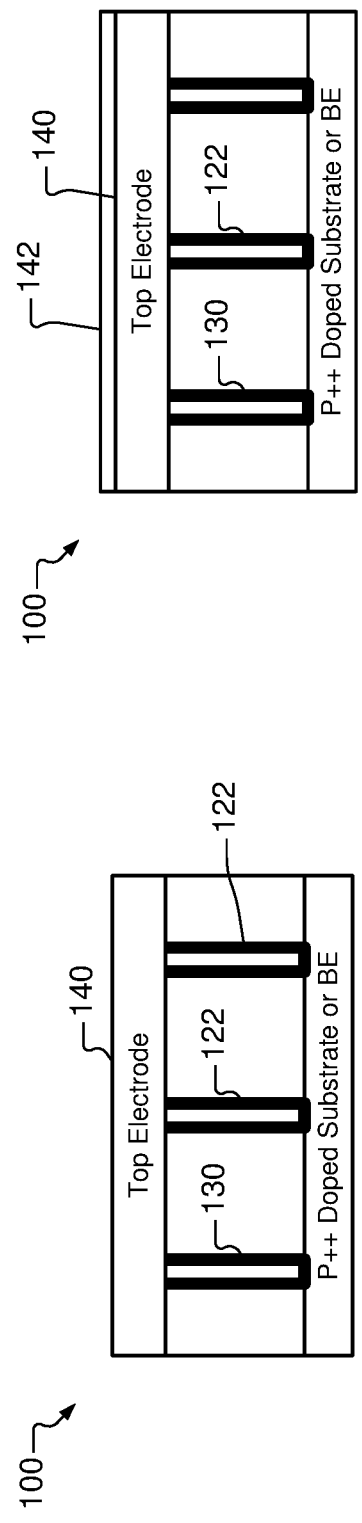

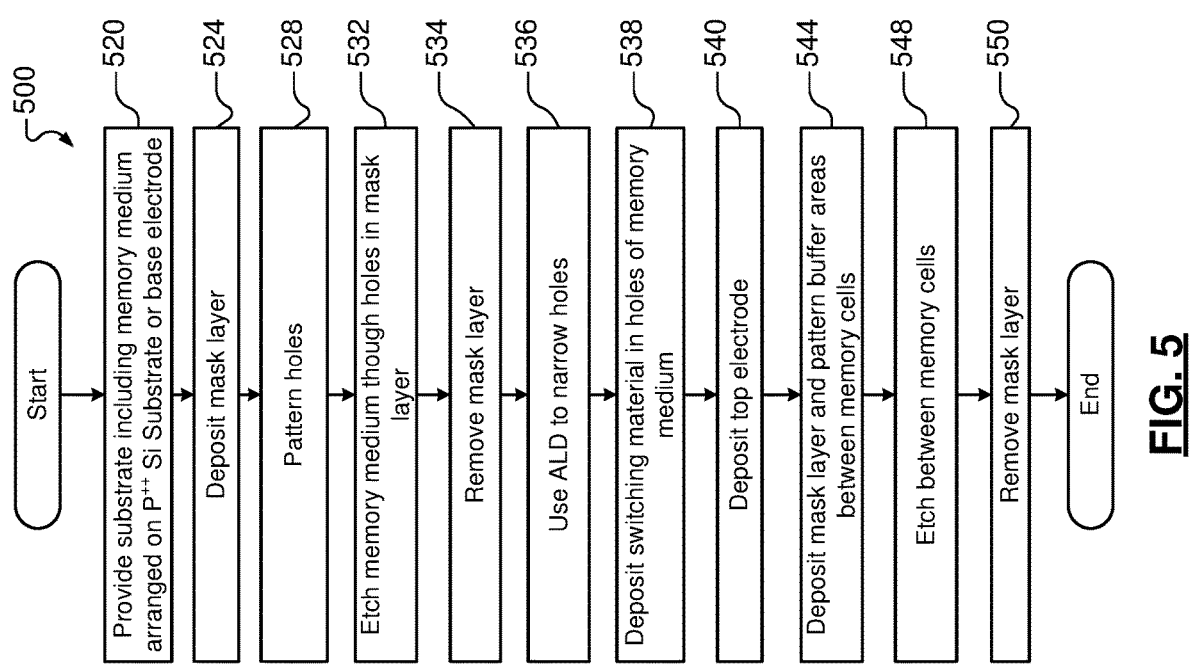

RESISTIVE RANDOM ACCESS MEMORY WITH PREFORMED FILAMENTS

CROSS-REFERENCE TO RELATED APPLICATIONS

This application is a U.S. National Phase Application under 35 U.S.C. 371 of International Application No. PCT/US2020/013304, filed on Jan. 13, 2020, which claims the benefit of U.S. Provisional Application No. 62/796,818, filed on Jan. 25, 2019. The entire disclosures of the applications referenced above are incorporated herein by reference.

FIELD

The present disclosure relates to memory and more particularly to resistive random access memory (RRAM) cells with preformed filaments.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Nonvolatile memory in electronic devices usually includes flash memory which has relatively high density and low cost. However, flash memory has several disadvantages including low operating speed, low write/erase cycle endurance, and high write voltage. Flash memory may reach miniaturization limits due to large leakage currents.

Resistive random access memory (RRAM) has been proposed as an alternative to flash memory. RRAM cells rely upon resistive switching (RS). In general, RRAM cells include a memory medium (such as an insulator or semiconductor) that is arranged between a top electrode and a base electrode. The memory medium has a programmable resistance by forming and disrupting a filament. The filament of each of the memory cells is programmed by an applied voltage into a high resistance state or a low resistance state.

Some RRAM cells use amorphous materials as the memory medium arranged between the top and bottom electrodes. During switching events, conductive filaments can be formed anywhere in the amorphous material. As a result, it can be difficult to accurately locate or confine the conductive filaments. In addition, the random formation of conductive filaments in the RRAM cells can also reduce the uniformity (and increase the variance) of performance among different cells.

Other RRAM cells attempt to minimize variations in filament formation using epitaxially-grown, single crystal materials with line defects. Filaments are formed in and constrained by the line defects. It is also difficult to consistently form the line defects at desired locations and with the proper density. Therefore, this approach is difficult to manufacture at higher volumes.

SUMMARY

A method for fabricating a plurality of resistive random access memory (RRAM) cells includes providing a substrate including a memory medium arranged on an underlying layer; creating channel holes in the memory medium having a first critical dimension in a range from 1 nm to 20 nm; depositing switching material defining a filament of the RRAM cells in the channel holes; depositing a top electrode of the RRAM cells on the memory medium and the switching material; and separating adjacent ones of the RRAM cells by etching the top electrode and the memory medium between adjacent ones of the channel holes.

In other features, creating the channel holes in the memory medium includes depositing a first mask layer on the memory medium; patterning the channel holes having the first critical dimension in the mask layer; etching the memory medium through the channel holes to the underlying layer; and removing the first mask layer.

In other features, creating the channel holes in the memory medium includes depositing a first mask layer on the memory medium; patterning the channel holes having a second critical dimension that is greater than the first critical dimension; etching the memory medium through the channel holes to the underlying layer; removing the first mask layer; and filling the channel holes with a conformal layer to reduce the second critical dimension of the channel holes to less than or equal to the first critical dimension.

In other features, filling the channel holes with the switching material includes depositing a doped conformal layer in the channel holes. The doped conformal layer is deposited using atomic layer deposition.

In other features, the memory medium is selected from a group consisting of silicon (Si), silicon germanium ($Si_xGe_y$), silicon dioxide ($SiO_2$), silicon nitride ($Si_aN_b$), metal oxides, and metal nitrides. The switching material is selected from a group consisting of doped silicon (Si), silicon germanium ($Si_xGe_y$), silicon dioxide ($SiO_2$), silicon nitride ($Si_aN_b$), metal oxides, and metal nitrides.

In other features, filling the channel holes with the switching material includes depositing a doped semi-conformal layer in the channel holes and wherein the doped semi-conformal layer is thicker at a bottom portion of the channel holes than at an upper portion of the channel holes.

In other features, filling the channel holes with the switching material includes depositing a plurality of alternating layers of metal and dielectric. The plurality of alternating layers of metal and dielectric define a plurality of filaments. The plurality of alternating layers of metal and dielectric are deposited using atomic layer deposition. The method includes, after depositing the switching material, performing chemical mechanical polishing to remove the switching material from a field region of the memory medium. The memory medium is selected from a group consisting of amorphous, polycrystalline and single crystal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 1A to 1K are side cross-sectional views of an example of a substrate including resistive random access memory (RRAM) cells according to the present disclosure;

FIG. 5 is a flowchart of an example of another method for fabricating RRAM cells according to the present disclosure; and FIG. 6 is a side cross-sectional view illustrating an example of switching material with alternating layers of dielectric and metal according to the present disclosure.

In the drawings, reference numbers may be reused to identify similar and/or identical elements.

DETAILED DESCRIPTION

One source of unreliability in RRAM cells involves resistance variations (cycle-to-cycle and/or device-to-device) in the low resistance state (LRS) and the high resistance state (HRS). The primary source of the resistance variations is caused by inconsistent formation and disruption of the filaments in the RRAM cells.

The present disclosure relates to RRAM cells and methods for creating RRAM cells. The RRAM cells include switching material (defining one or more filaments) that are patterned and etched. In some examples, the switching material is etched with a critical dimension that is in a range from 1 nm to 20 nm. In other examples, the switching material is etched with a critical dimension that is greater than or equal to 1 nm and less than or equal to 5 nm.

Some RRAM cells include a memory medium with epitaxially-grown, single crystal materials. Filaments are formed in the line defects. Dislocation control is used to generate reliable formation of the line defects and filaments in SiGe/Si epitaxial memory. The memory has high endurance and long retention, high on-off ratio, cycle-to-cycle uniformity, device-to-device uniformity, suppression of sneak paths and linear conductance update. However, memory using this approach is difficult to manufacture at higher volumes.

The method for fabricating RRAM cells according to the present disclosure includes switching material with filaments that are formed in the memory medium by patterning holes, etching and/or deposition. In some examples, the channel holes in the memory cells (for the switching material) have a critical dimension that is in a range from 1 nm to 20 nm. In other examples, the channel holes in the memory cells (for the switching material) have a critical dimension that is greater than or equal to 1 nm and less than or equal to 5 nm. This approach ensures that a filament channel will be located on every memory cell. Furthermore, the memory cell will have reduced variability since the critical dimension (CD) and location of the variable resistance channel is controlled.

The method for fabricating RRAM cells allows a wider variety of materials to be used. For example, the switching material doesn't need to be single crystalline. It can be amorphous or poly crystalline (even though polycrystalline materials may increase variability).

Figure 1J:
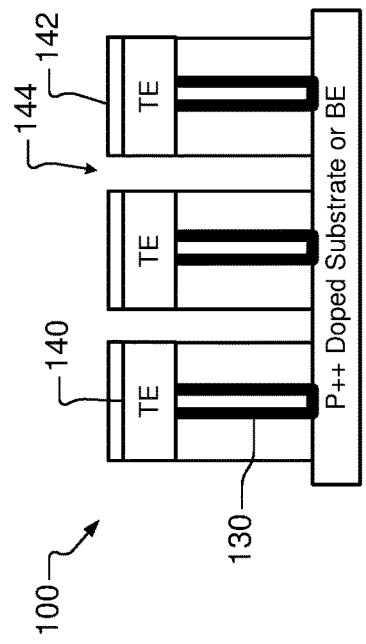

Referring now to FIGS. 1A to 1K, an example process for fabricating RRAM cells on a substrate 100 is shown. In FIG. 1A, an underlying layer 112 of the substrate 100 includes a $P^{++}$ doped substrate or a base electrode and/or other underlying layers. A memory medium 114 is deposited on the underlying layer 112. In some examples, the memory medium 114 is selected from a group consisting of silicon (Si), silicon germanium ($Si_xGe_y$ or SiGe where x and y are integers), silicon dioxide ($SiO_2$), silicon nitride ($Si_aN_b$ or SiN where a and b are integers), metal oxides, and metal nitrides. In some examples, the memory medium 114 includes a material selected from a group consisting of amorphous, polycrystalline and single crystal.

In FIGS. 1B and 1C, a mask layer 116 is deposited on the memory medium 114 and patterned to define channel holes 118 in the mask layer 116. In some examples, the channel holes 118 are uniformly spaced and have a critical dimension (CD) that is from 1 nm to 20 nm. In some examples, extreme ultraviolet (EUV) processing is performed to pattern the channel holes 118 with the CD from 1 nm to 20 nm. In other examples, the channel holes 118 that are created have a critical dimension (CD) that is higher and additional steps (such as atomic layer deposition (ALD) or direct self-assembly (DSA)) are performed to partially fill the channel holes 118 and reduce the CD of the channel holes 118 to a range from 1 nm to 20 nm.

In FIG. 1D, dielectric etching is performed to etch an area below the channel holes 118 through the memory medium 114 to the underlying layer 112 and to create channel holes 122 in the memory medium 114 for switching material.

In FIG. 1E, the mask layer 116 is etched or removed. In FIG. 1F, a switching material 130 is deposited in the channel holes 122. In some examples, the switching material 130 includes a conformal layer 132 that is deposited using atomic layer deposition (ALD) that is doped with a metal. The metal can segregate at a surface of the conformal layer to form a filament. In some examples, the switching material 130 includes doped Si, SiGe, $SiO_2$, SiN, metal oxides, and metal nitrides deposited by ALD, CVD or other processes. In some examples, chemical mechanical polishing (CMP), etching or another process is used to remove the conformal layer 132 in a field region of the substrate 100 (but not in the channel holes 122) prior to subsequent processing.

Figure 1I:
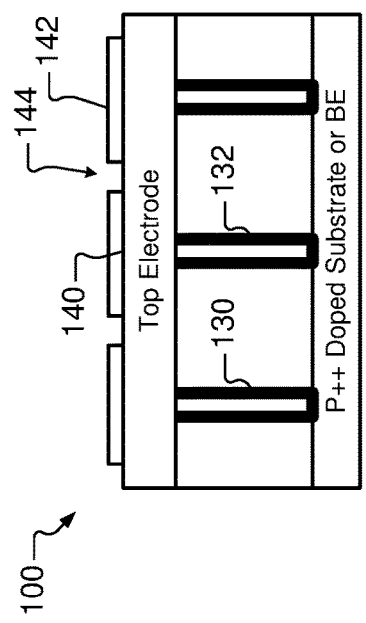
Figure 1K:
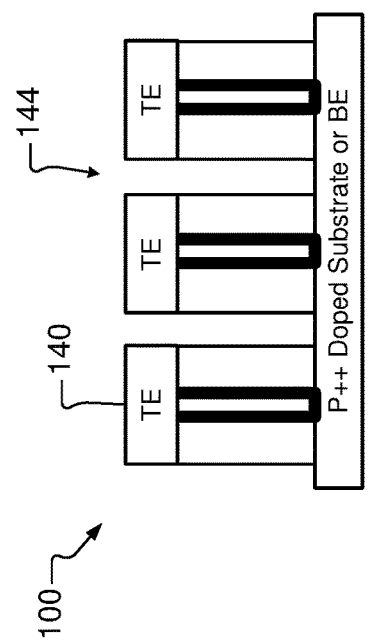

In FIG. 1G, a top electrode 140 is deposited. In some examples, the top electrode 140 is made of a material selected from a group consisting of silver (Ag), copper (Cu), copper tellurium (CuTe), and/or other metals that can form metal ions. In FIGS. 1H and 1I, a mask layer 142 is deposited on the top electrode 140 and patterned to form inter-cell holes 144. Conductor etching and dielectric etching are performed to remove material below the inter-cell holes 144 and separate adjacent RRAM cells. In FIG. 1K, the mask layer 142 is removed and further processing may be performed.

Figure 2:
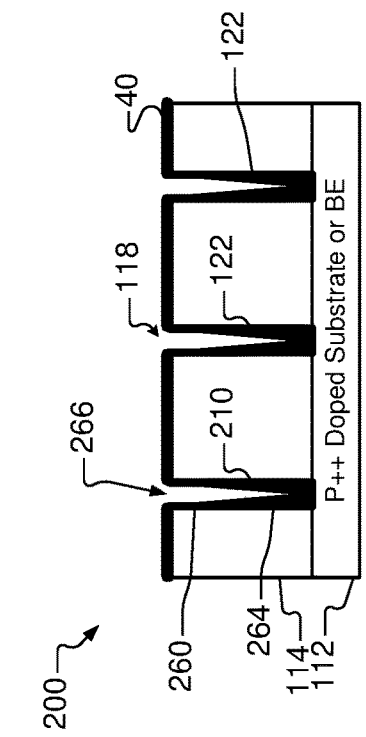
FIG. 2 is a side cross-sectional view of another example of a substrate including RRAM cells according to the present disclosure.

Referring now to FIG. 2, while the switching material can be conformal as described above, the switching material can also be semi-conformal. Ion FIG. 2, a substrate 200 includes switching material 210 that is deposited with an upper portion 260 located near an opening of the channel holes 122 that is thinner in a horizontal direction than a lower portion 264 at a bottom of the channel holes 122. In some examples, a "V"-shaped fill profile 266 is created.

This arrangement produces a higher electric field due to the decreasing thickness from the lower portion 264 to the upper portion 260. In some examples, an inhibitor plasma may be used prior to atomic layer deposition (or between ALD cycles) to inhibit deposition in the upper portion 260 of the channel holes 122 relative to the lower portion 264 of the channel holes 122 and to create the semi-conformal layer. An example of inhibitor plasma is disclosed in commonly assigned U.S. Pat. No. 9,425,078, which is entitled "Inhibitor Plasma Mediated Atomic Layer Deposition for Seamless Feature Fill", which is incorporated herein by reference in its entirety.

Figure 3:
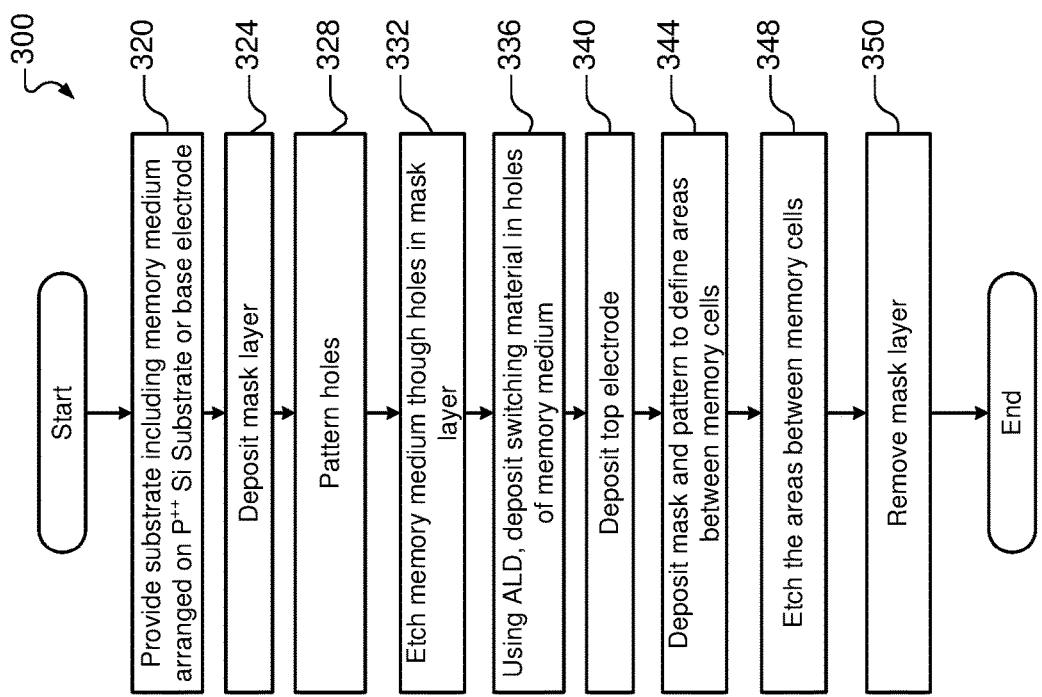
FIG. 3 is a flowchart of an example of a method for fabricating RRAM cells according to the present disclosure.

Referring now to FIG. 3, a method 300 for fabricating RRAM cells is shown. At 320, a substrate is provided that includes a memory medium arranged on an underlying layer such as a $P^{++}$ Si substrate or base electrode. At 324, a mask layer is deposited. At 328, a plurality of channel holes having a first critical dimension is patterned in the mask layer. In some examples, the first critical dimension is from 1 nm to 20 nm. In other examples, the first critical dimension is greater than or equal to 1 nm and less than or equal to 5 nm.

At 332, the memory medium is etched through the channel holes in the mask layer. At 336, a switching material is deposited in the channel holes of the memory medium. In some examples, atomic layer deposition is used. In some examples, chemical mechanical polishing, etching or another process is used to remove the switching material deposited on a field region of the substrate. At 340, a top electrode is deposited.

At 344, a mask layer is deposited and patterned to define inter-cell holes between the memory cells. At 348, the areas below the inter-cell holes and between the memory cells are etched using conductor etching and dielectric etching. At 350, the mask layer is removed. Further processing of the substrate may be performed.

Figure 4:
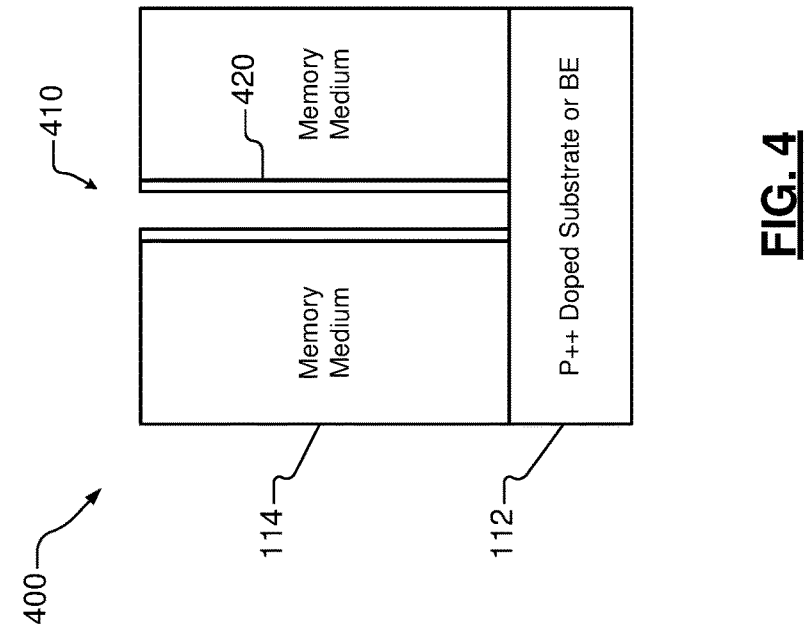
FIG. 4 is a side cross-sectional view illustrating an example of filling of holes to reduce a critical dimension of the switching material according to the present disclosure.

Referring now to FIG. 4, a substrate 400 includes the channel holes 410 that may be initially patterned in the mask layer with a second critical dimension that is greater than the first critical dimension. After removing the mask layer, the critical dimension of the channel holes 410 is further reduced by depositing a conformal layer 420 in the channel holes 410 to further reduce the critical dimension to the first critical dimension (e.g. a range from 1 nm to 20 nm (or in some examples, greater than or equal to 1 nm and less than or equal to 5 nm)). In some examples, ALD film is deposited. In some examples, the ALD film has the same composition as the film used for the memory medium. In some examples, the ALD film has a different composition than the film used for the switching material. For example, the film may lack the metal doping used for the switching material.

Referring now to FIG. 5, a method 500 for fabricating resistive random access memory cells is shown. At 520, a substrate is provided that includes a memory medium arranged on an underlying layer such as a $P^{++}$ Si substrate or base electrode. At 524, a mask layer is deposited. At 528, a plurality of channel holes having a second critical dimension (that is greater than the first critical dimension) is patterned in the mask layer. At 532, the memory medium is etched through the channel holes in the mask layer. At 534, the mask layer is removed.

At 536, film is deposited in the channel holes to reduce the critical dimension from the second critical dimension to the first critical dimension, respectively. In some examples, ALD is performed. At 538, a switching material is deposited in the channel holes of the memory medium. In some examples, atomic layer deposition is used to deposit a metal doped material. In some examples, chemical mechanical polishing (CMP), etching or another process is used to remove the switching material on a field region of the substrate. At 540, a top electrode is deposited.

At 544, a mask layer is deposited and patterned to define inter-cell holes arranged between the memory cells. At 548, the areas below the inter-cell holes (and between the RRAM cells) are etched using conductor etching and dielectric etching. At 550, the mask layer is removed. Further processing of the substrate may be performed.

Referring now to FIG. 6, preceding examples described above used doped film as the switching material. In other examples, a substrate 600 includes a switching material 610 with a plurality of layers 614-1, 614-2, . . . , and 614-L (collectively layers 614), where L is an integer greater than 2. The layers 614 alternate between metal and dielectric.

In some examples, L is an even number and there are L/2 layers of metal and L/2 layers of dielectric. In other examples, L is an odd number and there are an uneven number of layers of metal and dielectric. In some examples, each of the layers 614 are deposited using multiple ALD cycles. For example, R ALD cycles are used to deposit the dielectric layers and S ALD cycles are used to deposit the metal layers, where R and S are integers greater than one. The multi-layer arrangement allows multiple filaments to be formed in a single memory channel.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for fabricating a plurality of resistive random access memory (RRAM) cells, comprising:
   providing a substrate including a memory medium arranged on an underlying layer;
   creating channel holes in the memory medium; and
   depositing switching material by depositing a conformal layer doped with a metal in the channel holes, the metal segregating at a surface of the conformal layer defining a filament of the RRAM cells in the channel holes.

2. The method of claim 1, wherein creating the channel holes in the memory medium includes:
   depositing a first mask layer on the memory medium;
   patterning the channel holes having a first critical dimension in the first mask layer;

etching the memory medium through the channel holes to the underlying layer; and removing the first mask layer.

3. The method of claim 1, wherein creating the channel holes in the memory medium includes:

depositing a first mask layer on the memory medium;

patterning the channel holes having a second critical dimension that is greater than a first critical dimension in the first mask layer;

etching the memory medium through the channel holes to the underlying layer;

removing the first mask layer; and filling the channel holes with the doped conformal layer to reduce the second critical dimension of the channel holes to less than or equal to the first critical dimension.

4. The method of claim 1, wherein the doped conformal layer is deposited using atomic layer deposition.

5. The method of claim 1, wherein the memory medium is selected from a group consisting of silicon (Si), silicon germanium ($Si_xGe_y$), silicon dioxide ($SiO_2$), silicon nitride ($Si_aN_b$), metal oxides, and metal nitrides.

6. The method of claim 1, wherein the switching material is selected from a group consisting of doped silicon (Si), silicon germanium ($Si_xGe_y$), silicon dioxide ($SiO_2$), silicon nitride ($Si_aN_b$), metal oxides, and metal nitrides.

7. The method of claim 1, wherein filling the channel holes with the switching material includes depositing a doped semi-conformal layer in the channel holes and wherein the doped semi-conformal layer is thicker at a bottom portion of the channel holes than at a upper portion of the channel holes.

8. The method of claim 1, wherein filling the channel holes with the switching material includes depositing a plurality of alternating layers of metal and dielectric.

9. The method of claim 8, wherein the plurality of alternating layers of metal and dielectric define a plurality of filaments.

10. The method of claim 8, wherein the plurality of alternating layers of metal and dielectric are deposited using atomic layer deposition.

11. The method of claim 1, further comprising, after depositing the switching material, performing chemical mechanical polishing to remove the switching material from a field region of the memory medium.

12. The method of claim 1, wherein the memory medium is selected from a group consisting of amorphous, polycrystalline and single crystal.

13. The method of claim 1, wherein a first critical dimension of the channel holes is greater than or equal to 1 nm and less than or equal to 5 nm.

14. The method of claim 1, wherein a first critical dimension of the channel holes is in a range from 1 nm to 20 nm.

15. The method of claims 1, further comprising depositing a top electrode of the RRAM cells on the memory medium and the switching material.

16. The method of claim 15, further comprising, after depositing the top electrode, separating adjacent ones of the RRAM cells by etching the top electrode and the memory medium between adjacent ones of the channel holes.

\* \* \* \* \*